United States Patent
Marien et al.

(10) Patent No.: US 12,332,317 B2
(45) Date of Patent: Jun. 17, 2025

(54) SENSOR FOR A VEHICLE ELECTRICAL SYSTEM

(71) Applicants: Isabellenhuette Heusler GMBH & Co. KG, Dillenburg (DE); Bender GmbH & Co. KG, Gruenberg (DE)

(72) Inventors: Jan Marien, Herborn (DE); Benjamin Seel, Dillenburg-Eibach (DE); Andreas Lepper, Hohenahr (DE); Felix Lebeau, Herborn (DE); Alexander Wassmann, Siegen (DE); Mario Lehr, Gruenberg (DE); Daniel Woelfel, Lahnau (DE); Eckhard Broeckmann, Giessen (DE); Carsten Weiss, Giessen (DE); Matthias Gruen, Laubach (DE)

(73) Assignees: Isabellenhuette Heusler GMBH & Co. KG, Dillenburg (DE); Bender GMBH & Co. KG, Gruenberg (DE)

( * ) Notice: Subject to any disclaimer, the term of this patent is extended or adjusted under 35 U.S.C. 154(b) by 99 days.

(21) Appl. No.: 18/019,044

(22) PCT Filed: Jun. 30, 2021

(86) PCT No.: PCT/EP2021/067959
§ 371 (c)(1),
(2) Date: Jan. 31, 2023

(87) PCT Pub. No.: WO2022/028779
PCT Pub. Date: Feb. 10, 2022

(65) Prior Publication Data
US 2023/0288485 A1 Sep. 14, 2023

(30) Foreign Application Priority Data
Aug. 3, 2020 (DE) .......................... 102020120433.7

(51) Int. Cl.
G01R 31/3842 (2019.01)
G01R 31/28 (2006.01)

(52) U.S. Cl.
CPC ..... G01R 31/3842 (2019.01); G01R 31/2841 (2013.01)

(58) Field of Classification Search
CPC ........................ G01R 31/3842; G01R 31/2841
See application file for complete search history.

(56) References Cited

U.S. PATENT DOCUMENTS

| 2011/0093148 A1 | 4/2011 | Kuehner et al. |
| 2012/0126839 A1 | 5/2012 | Schäfer et al. |

(Continued)

FOREIGN PATENT DOCUMENTS

| DE | 102015008831 A1 | 1/2017 |
| EP | 0605800 A1 | 7/1994 |

(Continued)

OTHER PUBLICATIONS

EP0605800A1 English Translation, retrieved from Espace.net (Year: 1993).*

(Continued)

*Primary Examiner* — Minh Q Phan
(74) *Attorney, Agent, or Firm* — Caesar Rivise, PC

(57) ABSTRACT

The invention relates to a sensor(S), in particular for an electrical network of an electrically driven vehicle, in particular in an electric car. The sensor according to the invention comprises first of all a measuring device (ME) for current measurement and/or for voltage measurement in the electrical network, in particular with a low-resistance current sense resistor for current measurement according to the four-wire technique. Furthermore, the sensor(S) according to the invention comprises an integrated insulation monitoring device (ME, IQ, Rk, S3) for monitoring an electrical (Continued)

insulation of high-side and/or low-side of the electrical network. The sensor(S) according to the invention is characterized by the fact that the insulation monitoring device (ME, IQ, Rk, S3) operates actively and impresses measurement pulses into the electrical network for insulation monitoring.

19 Claims, 1 Drawing Sheet

(56) References Cited

U.S. PATENT DOCUMENTS

| | | |
|---|---|---|
| 2012/0154104 A1 | 6/2012 | Hetzler |
| 2012/0262151 A1 | 10/2012 | Mandic et al. |
| 2012/0327973 A1 | 12/2012 | Hetzler |
| 2014/0114591 A1 | 4/2014 | Bröckmann et al. |
| 2015/0177308 A1 | 6/2015 | Kullick et al. |
| 2017/0108544 A1 | 4/2017 | Schmelzer |
| 2019/0250202 A1* | 8/2019 | Shirakawa ........... H01B 13/067 |
| 2020/0025813 A1 | 1/2020 | Hackl et al. |

FOREIGN PATENT DOCUMENTS

| | | |
|---|---|---|
| EP | 0654673 B1 | 7/2002 |
| EP | 2542902 B1 | 1/2011 |
| JP | 2006177840 A | 7/2006 |
| JP | 2011250588 A | 12/2011 |
| JP | 2013032977 A | 2/2013 |
| WO | 2010/121841 A1 | 10/2010 |

OTHER PUBLICATIONS

English abstract of EP0605800A1.
English abstract of EP0654673B1.
English abstract of DE102015008831A1.
English abstract of DE19950008A1.
International Search Report for corresponding PCT Application No. PCT/EP2021/067959 dated Oct. 22, 2021.
Din EN 61557-8 with English abstract.

* cited by examiner

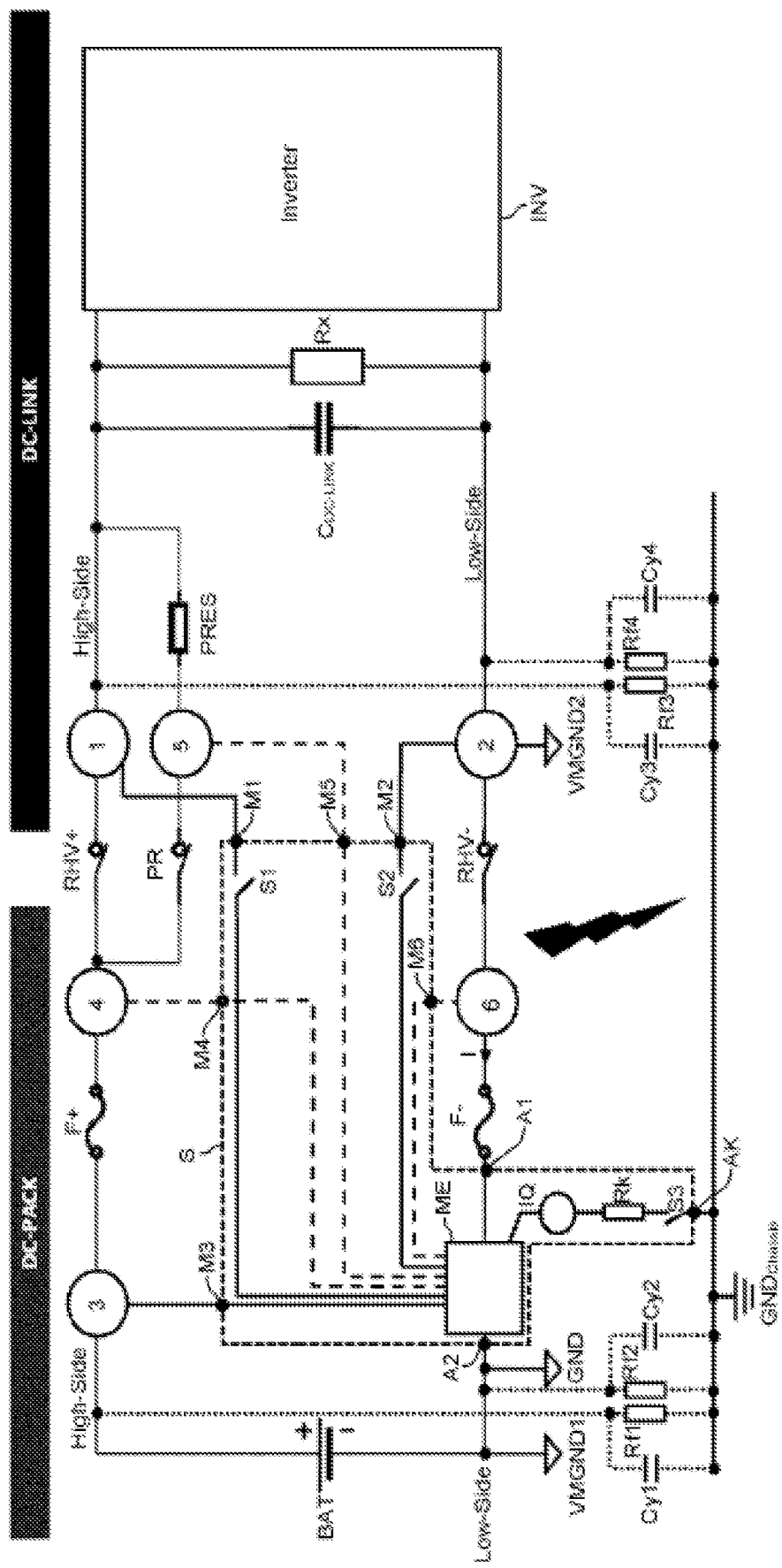

SENSOR FOR A VEHICLE ELECTRICAL SYSTEM

CROSS-REFERENCE TO RELATED APPLICATIONS

This application is a U.S. National Phase Application under 35 U.S.C. § 371 of PCT/EP2021/067959, filed Jun. 30, 2021, which claims priority from German Patent Application No. 10 2020 120 433.7, filed Aug. 3, 2020, the contents of which applications are incorporated herein by reference in their entireties.

BACKGROUND OF THE INVENTION

The invention relates to a sensor for an electrical on-board network of an electrically driven vehicle, in particular in an electric car.

In modern motor vehicles and in particular in electrically driven motor vehicles, electrical currents must be measured in the on-board network. For this purpose, the so-called four-wire technique can be used, which is known, for example, from EP 0 605 800 A1. The electrical current to be measured is passed through a low-resistance current sense resistor ("shunt"), with the voltage drop across the low-resistance current sense resistor being measured and forming a measure of the electrical current to be measured in accordance with Ohm's law. This measurement method according to the four-wire technique is used by current sensors such as those known from EP 2 542 902 B1 and WO 2010/121841 A1.

In addition, insulation monitoring is required in vehicle electrical systems, as described for example in the technical standard DIN EN 61557-8. For this purpose, various semiconductor manufacturers offer chips that enable passive insulation monitoring in addition to current measurement. However, active insulation monitoring is not possible with these known chips.

Therefore, different components are required for current measurement on the one hand and for active insulation monitoring on the other hand in the known vehicle electrical systems.

Finally, with regard to the prior art, reference should also be made to DE 10 2014 204 870 A1, DE 10 2015 008 831 A1 and DE 10 2008 010 980 A1. DE 10 2014 204 870 A1 discloses an insulation monitoring system, but this publication differs from the invention, inter alia, in the type of insulation monitoring and also in the type of coupling to the network.

SUMMARY

Therefore, the invention is based on the task of simplifying current measurement and insulation monitoring in an on-board electrical system.

This task is solved by a sensor according to the invention in accordance with the main claim.

The invention comprises the general technical teaching of integrating the technical functions of current measurement on the one hand and active insulation monitoring on the other hand in a single sensor, thereby reducing the constructional effort in the vehicle electrical system.

In accordance with the prior art, the sensor according to the invention therefore initially comprises a measuring device for current measurement and/or for voltage measurement in the electrical on-board network.

In a preferred embodiment of the invention, this measuring device for current measurement operates according to the known four-wire technique and for this purpose comprises a low-resistance current sense resistor ("shunt"), as described above with respect to the prior art.

However, the invention is not limited to the measuring principle of the four-wire technique with regard to the operation of the measuring device for current measurement. It is also possible that the measuring device for current measurement uses other measuring principles. For example, the measuring device for current measurement can have a Hall sensor, such as is known from EP 2 511 714 A2. Furthermore, within the scope of the invention, it is also possible for the measuring device for current measurement to apply different measuring principles in order to enable redundant current measurement. For example, the measuring device can have a low-resistance current sense resistor and additionally a Hall sensor. This type of redundant current measurement is also described in EP 2 511 714 A2.

In addition, the sensor according to the invention, like the conventional chips described at the beginning, comprises an integrated insulation monitoring device to monitor an electrical insulation of the vehicle electrical system at the high-side and/or at the low-side time of the vehicle electrical system.

The sensor according to the invention is characterized by the fact that the integrated insulation monitoring device operates actively and impresses measurement pulses into the vehicle electrical system for insulation monitoring. In contrast to the chips with an integrated insulation monitoring device described above, the insulation monitoring device in the sensor according to the invention does not operate pas-sively, or at least not exclusively.

The integration of the active insulation monitoring device into a sensor for current and voltage measurement offers the advantage that the customer no longer has to apply high voltage to his battery management system (BMS), which significantly simplifies its hardware architecture, reduces testing efforts during production and saves costs.

Another advantage of integrating the active insulation monitoring device into a sensor for current and voltage measurement according to the invention is that many components can be saved. For example, the known sensors for current and voltage measurement contain many components that a stand-alone insulation monitoring device also requires (such as voltage measurement inputs, A/D converter, microcomputer, galvanic insulation, communication interface). If the active insulation monitoring device is integrated into the sensor, these components of the current sensor can be shared by the active insulation monitoring device, so that duplication of these components is no longer necessary.

In the present description, the use of the sensor according to the invention in a vehicle electrical system is described. However, the sensor according to the invention can also be used in stationary battery applications. The specific term of an on-board network used in the context of the invention can therefore also be replaced by the more general term of an electrical network. However, for ease of understanding, the specific term of an on-board network is used throughout this description.

The coupling of measurement pulses into the vehicle electrical system required in the context of active insulation monitoring necessitates coupling of the insulation monitoring device to the vehicle electrical system. Preferably, this coupling of the insulation monitoring device for impressing the measurement pulses is not performed at the high-side (positive pole of the battery) and also not at the low-side (negative pole of the battery) of the vehicle electrical system, but at the chassis ground of the vehicle, as will be described in detail.

In one variant of the invention, a resistive coupling of the insulation monitoring device to the on-board power supply is provided, whereby the measurement pulses are DC measurement pulses (DC: Direct Current). In another variant of the invention, on the other hand, a capacitive coupling of the insulation monitoring device to the vehicle electrical system is provided, with the measurement pulses then being AC measurement pulses (AC: Alternating Current). In a third variant of the invention, a resistive coupling of the insulation monitoring device to the vehicle electrical system is also provided, but the measurement pulses are AC measurement pulses.

In the context of the invention, the term high-side—as already briefly addressed above-preferably has the meaning that the on-board power system can be connected to a positive terminal of a battery at the high-side. The term low-side, on the other hand, preferably has the meaning in the context of the invention that the on-board power system can be connected at the low-side to a negative terminal of the battery. To be distinguished from this is the so-called chassis-ground, which is formed by the vehicle and its chassis.

The active insulation monitoring device now preferably makes it possible to determine a leakage capacitance between the low-side and/or the high-side of the vehicle electrical system on the one hand and the chassis ground on the other.

It is also possible for the active insulation monitoring device to adapt the frequency of the measurement pulses coupled into the vehicle electrical system as a function of the leakage capacitance determined. For example, an active insulation monitoring device with a multi-frequency method is known from EP 2 717 063 A1, so that the contents of this patent application can be attributed to the present description with regard to the adaptation of the frequency of the measurement pulses.

It has already been briefly mentioned above that the measuring device of the sensor serving for current measurement preferably operates according to the four-wire technique as described, for example, in EP 0 605 800 A1. The sensor therefore preferably has two current connections in order to feed the on-board current to be measured into the sensor or to discharge it from the sensor. The measuring device then measures the on-board power supply current, for example, according to the four-wire technique.

Active insulation monitoring requires voltage measurement at various measuring points within the vehicle electrical system.

For this purpose, the sensor according to the invention first has a first voltage measuring terminal to measure the voltage at a first measuring point of the on-board power system at the high-side behind a switchable high-side contactor. It should be mentioned here that the terms "upstream" and "downstream" refer to the perspective of the battery, i.e. the first measuring point is located downstream of the switchable high-side contactor from the perspective of the battery. Thus, the first measuring point is located in the on-board power system at the high-side preferably between the high-side contactor and the load (e.g., inverter). Furthermore, it should be mentioned that the high-side contactor is preferably arranged in a main path, with a secondary path running parallel to the main path, which serves to limit the current during a switch-on process and contains a disconnect switch and a resistor ("pre-charge resistor"). The first measuring point for active insulation monitoring is then preferably located in the main path.

In addition, the sensor according to the invention has a second voltage measuring terminal for measuring the voltage at a second measuring point on the low-side of the on-board power supply downstream of a switchable low-side contactor. The second measuring point for active insulation monitoring is located in the on-board power system on the low side, i.e. preferably between the low-side contactor and the load (e.g. inverter).

Furthermore, the sensor preferably has a third voltage measuring terminal for voltage measurement at a third measurement point on the high-side of the on-board power system between the battery and the high-side contactor. Preferably, the on-board power system has a fuse at the high-side. The third measuring point for active insulation monitoring is then located on the high side, preferably between the battery and the fuse.

The voltage measurement at these three measuring points within the vehicle electrical system enables active insulation monitoring, whereby leakage capacitances and leakage resistances between the low-side and/or the high-side on the one hand and the chassis ground on the other can be derived from the voltage measured values. The calculation of the leakage capacitance or the leakage resistances is basically known from the known methods for active insulation monitoring. For example, reference is made to EP 0 654 673 B1, EP 2 256 506 B1 and DE 10 2018 117 296 B4, so that a detailed description of the calculation of the leakage resistances or leakage capacitances is not required here.

In the preferred embodiment of the invention, the sensor has a controllable, high-voltage-proof first disconnect switch at the first voltage measurement terminal on the high-side. The first disconnect switch optionally enables measurement sensing at the first voltage measurement port or disconnection of the first voltage measurement port.

Furthermore, the sensor according to the invention preferably comprises a controllable, high-voltage-proof second disconnect switch at the second voltage measurement terminal, wherein the second disconnect switch optionally enables a measurement interrogation at the second voltage measurement terminal or a disconnection of the second voltage measurement terminal.

It has already been mentioned above that measurement pulses are coupled into the vehicle electrical system as part of the active insulation monitoring. For this purpose, in the preferred embodiment, the sensor according to the invention has a coupling output in order to be able to couple the sensor to the chassis ground of the vehicle, the coupling output of the sensor preferably being of high impedance.

To generate the measurement pulses for active insulation monitoring, the sensor in the preferred embodiment has a pulse voltage source, the pulse voltage source generating the measurement pulses during active insulation monitoring and outputting them at the coupling output of the sensor.

Optionally, the sensor can have a controllable, high-voltage-proof third disconnect switch at the coupling output of the sensor, whereby the third disconnect switch optionally couples the pulse voltage source to the chassis ground or isolates it from the chassis ground.

Furthermore, in the preferred embodiments, the sensor includes a calculation unit for calculating at least one resistance value and one capacitance value within the scope of active insulation monitoring. The way of calculating the leakage resistances and/or the leakage capacitances is described in the patent applications EP 0 654 673 B1, EP 2

256 506 B1 and DE 10 2018 117 296 B4 already mentioned above, so that a detailed description of the calculation is dispensable here.

For example, the calculation unit can calculate the following quantities as a function of the voltage measurement values and the measurement pulses of the pulse voltage source:

- A first leakage resistance between the high-side of the on-board power supply before the high-side contactor on the one hand and the chassis sound of the vehicle on the other hand.
- A first leakage capacitance between the high-side of the on-board power supply before the high-side contactor on the one hand and the chassis ground of the vehicle on the other hand.
- A second leakage capacitance between the low-side of the on-board power system before the low-side contactor on the one hand and the chassis ground of the vehicle on the other hand.
- A second leakage capacitance between the low-side of the on-board power supply before the low-side contactor on the one hand and the chassis ground of the vehicle on the other hand.
- A third leakage capacitance between the high-side of the vehicle electrical system downstream of the high-side contactor on the one hand and the chassis ground of the vehicle on the other hand.
- A third leakage capacitance between the high-side of the vehicle electrical system downstream of the high-side contactor on the one hand and the chassis ground of the vehicle on the other hand.
- A fourth leakage capacitance between the low side of the vehicle electrical system downstream of the low-side contactor on the one hand and the chassis ground and of the vehicle on the other hand.
- A fourth leakage capacitance between the low-side of the on-board power system behind the low-side contactor on the one hand and the chassis ground of the vehicle on the other hand.

Thus, within the scope of the invention, leakage resistances and leakage capacitances with respect to chassis ground can preferably be determined both in the DC pack and in the DC link, and separately for high-side and low-side of the on-board power system.

The combination of the results of the insulation monitoring in conjunction with the results of the voltage measurement at the three measuring points enables a statement to be made about the insulation level within the HV battery or in the powertrain of an electrically driven motor vehicle, as well as a statement about the polarity of the insulation fault on the DC link side (HV-Pos or HV-Neg). In addition to measuring the insulation on the DC pack side (while the main contactors are open and when the switch is open in the secondary path parallel to the high-side contactor and when the disconnect switches are open in the measuring paths for the first and second measuring points), the insulation monitoring device also determines the polarity of the insulation fault with regard to HV-Pos/HV-Neg and the separate values of leakage resistance to chassis ground within the HV pack side in combination with the measured voltage at the third measuring point. If the main contactors are now closed, the insulation value for the entire vehicle is determined as the resulting parallel value of HV-Pack and HV-Link and, taking into account the measured voltage at the third measuring point, the polarity of the insulation fault with respect to HV-Pos/HV-Neg as well as the separate values of the leakage resistances, so that the leakage resistances with respect to chassis ground can also be calculated behind the contactors.

The three voltage measuring terminals mentioned above are used for active insulation monitoring, as described above. However, the sensor may also have other voltage measuring terminals that measure the voltage in the vehicle electrical system at other measurement points.

For example, a fourth voltage measuring terminal may be provided to measure the voltage in the on-board power system at a fourth measurement point at the high-side of the on-board power system before the switchable high-side contactor. In the preferred embodiment, the fourth measuring point is located on the high-side behind the fuse and before the aforementioned branch into the main path and the secondary path serving for current limitation.

Furthermore, a fifth voltage measuring terminal can be provided to measure the voltage at a fifth measuring point in the aforementioned secondary path that runs parallel to the switchable high-side contactor on the high-side of the on-board power system. Such secondary paths parallel to the switchable high-side contactor are known from the prior art and enable a soft switch-on process when the high-side contactor is switched on. For this purpose, the switch in the secondary path is closed first, in which a resistor ("precharge resistor") limits the current. Only then is the high-side contactor closed.

Furthermore, the sensor can have a sixth voltage measuring terminal to measure the voltage at a sixth measurement point on the low side of the vehicle electrical system before the switchable low-side contactor. The sixth measuring point is preferably located on the low-side between the fuse and the low-side contactor.

These three further voltage measuring terminals can serve other purposes than active insulation monitoring.

Furthermore, it is to be noted that the integration of the sensor for current/voltage measurement on the one side and the active insulation monitoring device on the other side can be done in a common integrated circuit ("chip"). However, it is also possible that both components (sensor for current/voltage measurement and active insulation monitoring device) are only arranged on a common printed circuit board or also only in a common housing.

Furthermore, it should be mentioned that the invention does not only claim protection for the above-described sensor according to the invention as a single component. Rather, the invention also claims protection for a battery management system (BMS) for an on-board network of an electrically driven vehicle with such a sensor according to the invention. The battery management system then also comprises the measurement paths between the voltage measurement terminals of the sensor and the associated measurement points. Furthermore, the battery management system then also comprises a coupling path between the coupling output of the sensor and the chassis ground of the vehicle.

Furthermore, it should be mentioned that the invention also claims protection for a complete on-board network of a vehicle with such a battery management system with the sensor according to the invention. The on-board network may also include, for example, the following further components:

- A battery for powering the on-board network, the battery preferably being rechargeable.
- A discharge circuit between the high-side and the low-side of the on-board network downstream of the high-side contactor and the low-side contactor.
- An inverter.

Finally, the invention also claims protection for a complete vehicle (e.g. electric car) with such an on-board power system, which is equipped with the battery management system with the sensor according to the invention.

BRIEF DESCRIPTION OF THE DRAWINGS

FIG. 1 shows a circuit diagram of an on-board network for an electrically driven motor vehicle according to the invention.

DETAILED DESCRIPTION

The on-board network connects a DC pack of the electrically driven motor vehicle with a DC link, as is known from the prior art. The DC pack is connected to the DC link via two switchable contactors RHV+, RHV− on a high side and on a low side respectively.

The on-board power supply is fed by a rechargeable battery BAT, with a positive terminal + of the battery BAT being connected to the high side of the on-board power supply, while a negative terminal − of the battery BAT is connected to the low side of the on-board power supply. The low side of the vehicle electrical system thus forms a battery ground, which is represented by the symbols GND, VMGND1, VMGMD2. However, this must be distinguished from a chassis-ground $GND_{Chassis}$, which is not normally connected to the vehicle electrical system.

In the on-board power supply, fuses F+, F− are located in the DC pack both on the high side and on the low side, which is known from the prior art.

Furthermore, it should be mentioned that a secondary path is connected in parallel to the switchable contactor RHV+ at the high-side of the on-board power supply, which contains a resistor PRES ("pre-charge resistor") on the one hand and a disconnect switch PR on the other hand. Before the two contactors RHV+, RHV− are switched on, the disconnect switch PR is first closed, whereby a smaller current then initially flows via the secondary path. Only then is the RHV+ contactor closed. This step-by-step closing of the disconnect switch PR and the contactor RHV+ prevents a sudden increase in current in the vehicle electrical system during a switch-on process.

A buffer capacitor $C_{DC-Link}$ is connected in the DC link between the high side and the high side.

Furthermore, a discharge circuit Rx is connected in the DC link between the high side and the high side, which is only shown schematically here.

Finally, the on-board power supply feeds an inverter INV, which is also only shown schematically here.

In the on-board power supply there is now a sensor S according to the invention, which has two functions. On the one hand, the sensor S enables measurement of an on-board power supply current I according to the four-wire technique. On the other hand, the sensor S also enables active insulation monitoring, the two functions being described below.

For current measurement, the sensor S has two current connections A1, A2 for introducing the on-board power system current I to be measured into the sensor S and discharging it from the sensor S, respectively. A measuring device ME then measures the on-board power supply current I in the sensor S, whereby the measuring device can operate, for example, according to the four-wire technique as known from EP 0 605 800 A1.

In addition, the sensor S has three voltage measuring terminals M1, M2 and M3 for active insulation monitoring, which measure the voltage in the vehicle electrical system at three measuring points 1, 2 and 3 respectively.

For active insulation monitoring, the sensor S also has a pulse voltage source IQ which outputs measurement pulses at a coupling output AK via a coupling resistor Rk and a controllable switch S3, the coupling output AK being connected to the chassis ground GND chassis. The measuring device ME can then calculate the following leakage resistances or leakage capacitances from the voltage measured values at the measuring points 1, 2, 3:

A first leakage resistance Rf1 between the high-side of the on-board power supply before the high-side contactor RHV+ on the one hand and the chassis ground $GND_{CHASSIS}$ of the vehicle on the other hand.

A first leakage capacitance Cy1 between the high side of the vehicle electrical system before the high-side contactor RHV+ on the one hand and the chassis ground $GND_{CHASSIS}$ of the vehicle on the other.

A second leakage resistance Rf2 between the low-side of the vehicle electrical system upstream of the low-side contactor RHV− on the one hand and the chassis ground $GND_{CHASSIS}$ of the vehicle on the other.

A second leakage capacitance Cy2 between the low-side of the vehicle electrical system before the low-side contactor RHV− on the one hand and the chassis ground $GND_{CHASSIS}$ of the vehicle on the other.

A third leakage resistance Rf3 between the high side of the vehicle electrical system downstream of the high-side contactor RHV+ on the one hand and the chassis ground $GND_{CHASSIS}$ of the vehicle on the other.

A third leakage capacitance Cy3 between the high side of the vehicle electrical system downstream of the high-side contactor RHV− on the one hand and the chassis ground $GND_{CHASSIS}$ of the vehicle on the other.

A fourth leakage resistance Rf4 between the low-side of the vehicle electrical system downstream of the low-side contactor RHV− on the one hand and the chassis ground $GND_{CHASSIS}$ and of the vehicle on the other hand.

A fourth leakage capacitance Cy4 between the low-side of the vehicle electrical system downstream of the low-side contactor RHV− on the one hand and the chassis ground $GND_{CHASSIS}$ of the vehicle on the other.

The calculation of the leakage resistances Rf1, Rf2, Rf3, Rf4 and the leakage capacitances Cy1, Cy2, Cy3, Cy4 can be performed in a conventional manner, as explained for example in EP 0 654 673 B1, EP 2 256 506 B1 and DE 10 2018 117 296 B4.

Furthermore, the sensor S has several disconnect switches S1, S2, S3, which are high voltage resistant and allow disconnection of the voltage measurement terminals M1, M3, M3 and the coupling output AK, respectively.

Finally, the sensor S has three further voltage measuring terminals M4, M5, M6, which enable voltage measurement at three further measurement points 4, 5, 6 within the vehicle electrical system. However, the voltage measurement at the measuring points M4, M5, M6 is optional and has nothing to do with active insulation monitoring.

The invention is not limited to the preferred embodiment described above. Rather, a large number of variants and variations are possible which also make use of the inventive idea and therefore fall within the scope of protection. In particular, the invention also claims protection for the subject-matter and the features of the dependent claims independently of the claims referred to in each case and in particular also without the features of the main claim. The invention thus comprises various aspects of invention which enjoy protection independently of one another.

LIST OF REFERENCE SIGNS

1 First measuring point on the high side of the vehicle electrical system behind the switchable contactor RHV+.
2 Second measuring point on the low side of the vehicle electrical system behind the switchable contactor RHV−.
3 Third measuring point on the high side of the vehicle electrical system before the switchable contactor RHV+.
4 Fourth measuring point on the high side of the vehicle electrical system upstream of the switchable contactor RHV+.
5 Fifth measuring point on the high side of the vehicle electrical system in the secondary path parallel to the switchable contactor RHV+.
6 Sixth measuring point on the low side of the on-board power supply upstream of the switchable contactor
A1 Current connection for introducing the vehicle electrical system current into the sensor
A2 Current connection for discharging the on-board power system current from the sensor
AK Coupling output of the sensor
BAT Accumulator
$C_{DC\text{-}LINK}$ Buffer capacitor
Cy1 Leakage capacitance between high-side of the on-board power supply before the switchable contactor and chassis-ground $GND_{Chassis}$
Cy2 Leakage capacitance between low-side of the Bornetz before the switchable contactor and chassis-ground GND chassis
Cy3 Leakage capacitance between high-side of the Bornetz behind the switchable contactor and chassis ground GND chassis
Cy4 Leakage capacitance between low-side of the mains behind the switchable contactor and chassis-ground GND chassis
F− Fuse on the low side of the on-board network
F+ Fuse on the high side of the vehicle electrical system
GND Battery ground
$GND_{Chassis}$ Chassis ground
I On-board power supply
INV Inverter
IQ Pulse voltage source
M1-M6 Voltage measuring terminals of the sensor
ME Measuring device of the sensor
+ Positive pole of battery BAT
− Negative pole of the battery BAT
PR Switch in the secondary path in parallel with the switchable contactor RHV+
PRES Resistor in the secondary path parallel to the RHV+ switchable contactor
RHV− Switchable contactor on the low side of the vehicle electrical system
RHV+ Switchable contactor on the high side of the on-board network
Rk Coupling resistor
Rx Discharge circuit
Ry1 Leakage resistance between high side of the on-board network before the switchable contactor and chassis ground GND chassis
Ry2 Leakage resistance between low-side of the Bornetz before the switchable contactor and chassis-ground GND chassis
Ry3 Leakage resistance between high-side of the Bornetz behind the switchable contactor and chassis ground GND chassis
Ry4 Leakage resistance between low-side of the mains behind the switchable contactor and chassis ground GND chassis
S Sensor
S1-S3 Controllable disconnect switch
VMGND1 Battery ground
VMGND2 Battery ground

What is claimed is:

1. A sensor for an electrical network, comprising:
a) a measuring device for at least one of current measurement and voltage measurement in the electrical network, and
b) an integrated insulation monitoring device for monitoring electrical insulation of at least one of a high-side and a low-side of the electrical network,
c) wherein the integrated insulation monitoring device operates actively and impresses measurement pulses into the electrical network for insulation monitoring,
the high-side is connectable to a positive terminal of a battery,
the low-side is connectable to a negative pole of the battery,
a chassis ground is provided,
the integrated insulation monitoring device determines a leakage capacitance between at least one of the low-side and the high-side of the electrical network on the one band and the chassis ground of the electrical network on the other hand, and
the integrated insulation monitoring device adapts the frequency of the measurement pulses as a function of the leakage capacitance determined.

2. The sensor according to claim 1, wherein the measuring device comprises a low-resistance current sense resistor for current measurement according to a four-wire technique.

3. The sensor according to claim 1, further comprising a resistive coupling of the integrated insulation monitoring device to the electrical network, the measurement pulses being DC measurement pulses.

4. The sensor according to claim 1, further comprising a capacitive coupling of the integrated insulation monitoring device to the electrical network, the measurement pulses being AC measurement pulses.

5. The sensor according to claim 1, further comprising a resistive coupling of the integrated insulation monitoring device to the electrical network, the measurement pulses being AC measurement pulses.

6. A sensor for an electrical network, comprising:
a) a measuring device for at least one of current measurement and voltage measurement in the electrical network,
b) an integrated insulation monitoring device for monitoring electrical insulation of at least one of a high-side and a low-side of the electrical network,
c) wherein the integrated insulation monitoring device operates actively and impresses measurement pulses into the electrical network for insulation monitoring,
d) a first current connection for introducing a mains current of the electrical network into the sensor, and
e) a second current connection for discharging the mains current of the electrical network from the sensor, f) wherein the measuring device measures the mains current.

7. A sensor for an electrical network, comprising:
a) a measuring device for at least one of current measurement and voltage measurement in the electrical network,
b) an integrated insulation monitoring device for monitoring electrical insulation of at least one of a high-side and a low-side of the electrical network,
c) wherein the integrated insulation monitoring device operates actively and impresses measurement pulses into the electrical network for insulation monitoring,
d) a first voltage measuring terminal for voltage measurement at a first measuring point on the high side of the electrical network downstream of a switchable high-side contactor on the high side of the electrical network,
e) a second voltage measuring terminal for voltage measurement at a second measuring point on the low side of the electrical network downstream of a switchable low-side contactor on the low side of the electrical network, and
f) a third voltage measuring terminal for voltage measurement at a third measuring point on the high-side of the electrical network between the battery and the high-side contactor on the high-side of the electrical network.

8. The sensor according to claim 7, further comprising at least one of the following:
a) a controllable, high-voltage-proof first disconnect switch at the first voltage measurement terminal, the first disconnect switch selectively enabling measurement sensing at the first voltage measurement terminal or disconnecting the first voltage measurement terminal, and
b) a controllable, high-voltage-proof second disconnect switch at the second voltage measurement terminal, the second disconnect switch optionally enabling a measurement interrogation at the second voltage measurement terminal or disconnecting the second voltage measurement terminal.

9. The sensor according to claim 7, further comprising at least one of:
a) a fourth voltage measuring terminal for voltage measurement at a fourth measuring point on the high-side of the electrical network before the switchable high-side contactor on the high-side of the electrical network,
b) a fifth voltage measuring terminal for voltage measurement at a fifth measuring point in a secondary path running parallel to the switchable high-side contactor at the high-side of the electrical network, and
c) a sixth voltage measuring terminal for voltage measurement at a sixth measuring point on the low side of the electrical network upstream of the switchable low-side contactor on the low side of the electrical network.

10. A sensor for an electrical network, comprising:
a) a measuring device for at least one of current measurement and voltage measurement in the electrical network,
b) an integrated insulation monitoring device for monitoring electrical insulation of at least one of a high-side and a low-side of the electrical network,
c) wherein the integrated insulation monitoring device operates actively and impresses measurement pulses into the electrical network for insulation monitoring,
d) a coupling output for coupling the sensor to a chassis ground,
e) a pulse voltage source for active insulation monitoring, the pulse voltage source generating the measurement pulses during active insulation monitoring and outputting them at the coupling output, and
f) a controllable, high-voltage-proof third disconnect switch at the coupling output of the sensor, the third disconnect switch optionally coupling the pulse voltage source to the electrical network or isolating it from the electrical network.

11. The sensor according to claim 10, further comprising a computing unit for computing at least one of a resistance value and a capacitance value in the context of insulation monitoring.

12. The sensor according to claim 11, wherein the computing unit calculates the following variables as a function of the voltage measurement value at at least one of the voltage measurement terminals and the measurement pulses of the pulse voltage source:
a) a first resistance between the high-side of the electrical network before the high-side contactor on the one hand and the chassis ground on the other hand, and
b) a first capacitance between the high-side of the electrical network upstream of the high-side contactor on the one hand and the chassis ground on the other hand.

13. The sensor according to claim 11, wherein the computing unit calculates at least one of the following variables as a function of the voltage measurement value at at least one of the voltage measurement terminals and the measurement pulses of the pulse voltage source:
a) a second resistance between the low-side of the electrical network before the low-side contactor on the one hand and the chassis ground on the other hand, and
b) a second capacitance between the low-side of the electrical network upstream of the low-side contactor on the one hand and the chassis ground on the other hand.

14. The sensor according to claim 11, wherein the computing unit calculates at least one of the following variables as a function of the voltage measurement value at at least one of the voltage measurement terminals and the measurement pulses of the pulse voltage source:
a) a third resistance between the high-side of the electrical network behind the high-side contactor on the one hand and the chassis ground on the other hand, and
b) a third capacitance between the high side of the electrical network behind the high side contactor on the one hand and the chassis ground on the other hand.

15. The sensor according to claim 11, wherein the computing unit calculates, as a function of the voltage measurement value at at least one of the voltage measurement terminals and the measurement pulses of the pulse voltage source, at least one of the following variables:
a) a fourth resistance between the low-side of the electrical network behind the low-side contactor on the one hand and the chassis ground on the other hand, and
b) a fourth capacitance between the low-side of the electrical network behind the low-side contactor on the one hand and the chassis ground on the other hand.

16. A battery management system for an electrical network, comprising:
a) a sensor for the electrical network, the sensor including:
a measuring device for at least one of current measurement and voltage measurement inn the electrical network, and
an integrated insulation monitoring device for monitoring electrical insulation of at least one of a high-side and a low-side of the electrical network, wherein the integrated insulation monitoring device operates actively and impresses measurement pulses into the electrical network for insulation monitoring;
b) a first measurement path from the first voltage measurement terminal of the sensor to the first measurement point on the high side of the electrical network downstream of the high-side contactor;
c) a second measuring path from the second voltage measuring terminal of the sensor to the second measuring point on the low side of the electrical network downstream of the low-side contactor;
d) a third measuring path from the third voltage measuring terminal of the sensor to the third measuring point at the high-side of the electrical network before the high-side contactor; and
e) a coupling path between the coupling output of the sensor and the chassis ground.

17. An electrical network with a battery management system according to claim 16.

18. The electrical network according to claim 17, further comprising at least one of:
a) a battery for feeding the electrical network, the battery preferably being rechargeable,
b) a discharge circuit between the high-side and the low-side of the electrical network downstream of the high-side contactor and downstream of the low-side contactor, and
c) an inverter fed by the high-side and the low-side of the electrical network.

19. A vehicle with an electrical network according to claim 17.

* * * * *